(12) United States Patent
Shih et al.

(10) Patent No.: US 11,031,348 B2
(45) Date of Patent: Jun. 8, 2021

(54) SEMICONDUCTOR STRUCTURE

(71) Applicant: NANYA TECHNOLOGY CORPORATION, New Taipei (TW)

(72) Inventors: Shing-Yih Shih, New Taipei (TW); Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/520,623

(22) Filed: Jul. 24, 2019

(65) Prior Publication Data
US 2021/0028121 A1   Jan. 28, 2021

(51) Int. Cl.
*H01L 23/552* (2006.01)
*H01L 23/00* (2006.01)
*H01L 23/48* (2006.01)

(52) U.S. Cl.
CPC .......... *H01L 23/552* (2013.01); *H01L 23/481* (2013.01); *H01L 24/09* (2013.01)

(58) Field of Classification Search
CPC ...... H01L 23/552; H01L 23/481; H01L 24/09
USPC ....................................................... 257/659
See application file for complete search history.

(56) References Cited

U.S. PATENT DOCUMENTS

| | | | | |
|---|---|---|---|---|
| 2007/0275514 A1* | 11/2007 | Itou | ........................ | H01L 21/743 438/151 |
| 2009/0160051 A1* | 6/2009 | Lee | ........................ | H01L 24/05 257/737 |
| 2009/0321796 A1* | 12/2009 | Inohara | ................. | H01L 23/481 257/288 |
| 2011/0291279 A1* | 12/2011 | McGahay | ......... | H01L 21/76898 257/758 |
| 2011/0304057 A1* | 12/2011 | Matsumoto | ........... | H01L 23/481 257/774 |
| 2012/0074584 A1* | 3/2012 | Lee | .................... | H01L 21/76898 257/774 |
| 2012/0094437 A1* | 4/2012 | Han | ................... | H01L 21/76801 438/109 |
| 2014/0070426 A1 | 3/2014 | Park et al. | | |

FOREIGN PATENT DOCUMENTS

| | | |
|---|---|---|
| CN | 102760710 B | 2/2016 |
| WO | 2019139625 A1 | 7/2019 |

OTHER PUBLICATIONS

Office Action dated Mar. 18, 2020 related to Taiwanese Application No. 108141018.

* cited by examiner

*Primary Examiner* — Dzung Tran
(74) *Attorney, Agent, or Firm* — Muncy, Geissler, Olds & Lowe, P.C.

(57) ABSTRACT

The present disclosure provides a semiconductor structure, including a substrate having a front surface and a back surface, at least one semiconductor device, a first TSV disposed in the substrate, an insulating layer surrounding the first TSV, a shielding layer surrounding the insulating layer, and a second TSV adjacent to the first TSV. The semiconductor device is disposed in a device region of the substrate. The first TSV is exposed by the front surface and the back surface of the substrate. The insulating layer includes an electrically insulating material. The shielding layer includes an electrically conductive material coupled to ground through a ground layer. The second TSV is exposed by the front surface and the back surface of the substrate.

20 Claims, 3 Drawing Sheets

US 11,031,348 B2

SEMICONDUCTOR STRUCTURE

TECHNICAL FIELD

The present disclosure relates to a semiconductor structure, and more particularly, to a semiconductor structure having shielding layer disposed between two through-substrate vias (TSVs).

DISCUSSION OF THE BACKGROUND

The semiconductor industry continues to improve the integration density of various electronic components (e.g., transistors, diodes, resistors, capacitors, etc.) by continual reductions in minimum feature size, which allow more components to be integrated into a given area. To achieve compact integration and miniaturization of semiconductor components, the requirements of the package structure are also increased.

Devices in semiconductor dies may cause electrical noise and electromagnetic interference. Noisy sources including radio frequency devices generate electrical noise in signals carried in conductive structures. The electrical noise in the conductive structures impact other signals and devices in the package. Minimizing these noisy electrical signals are important topics in semiconductor packaging to enable high integration density.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure, including a substrate having a front surface and a back surface, at least one semiconductor device, a first through-substrate via (TSV) disposed in the substrate, an insulating layer surrounding the first TSV, a shielding layer surrounding the insulating layer, and a second TSV adjacent to the first TSV. The semiconductor device is disposed in a device region of the substrate. The first TSV is exposed by the front surface and the back surface of the substrate. The insulating layer includes an electrically insulating material. The shielding layer includes an electrically conductive material coupled to ground through a ground layer. The second TSV is exposed by the front surface and the back surface of the substrate.

In some embodiments, the first TSV and the second TSV are a substantially cylindrical shape, and the shielding layer is disposed circumferentially about the first TSV.

In some embodiments, a distance between the first TSV and the second TSV is between 1.5 to 2 times a radius of the first TSV.

In some embodiments, a distance between the first TSV and the second TSV is between 7.5 μm and 10 μm.

In some embodiments, the substrate is in contact with a bottom surface of the shielding layer.

In some embodiments, the ground layer is disposed in a redistribution layer of the substrate.

In some embodiments, the ground layer is disposed in the device region of the substrate.

Another aspect of the present disclosure provides a semiconductor structure, including a substrate having a front surface and a back surface, at least one semiconductor device, a first TSV disposed in the substrate, an insulating layer surrounding the first TSV, a shielding layer surrounding the insulating layer, and a second TSV adjacent to the first TSV. The semiconductor device is disposed in a device region of the substrate. The first TSV is exposed by the front surface and the back surface of the substrate. The insulating layer includes an electrically insulating material. The shielding layer includes an electrically conductive material coupled to ground through a first contact pad on the front surface of the substrate. The second TSV is exposed by the front surface and the back surface of the substrate.

In some embodiments, the first TSV and the second TSV are a substantially cylindrical shape, and the shielding layer is disposed circumferentially about the first TSV.

In some embodiments, a distance between the first TSV and the second TSV is between 1.5 to 2 times a radius of the first TSV.

In some embodiments, a distance between the first TSV and the second TSV is between 7.5 μm and 10 μm.

In some embodiments, the semiconductor structure further includes a first circuit layer disposed between the first contact pad on the front surface of the substrate and the shielding layer.

In some embodiments, the first circuit layer is electrically connected to the first contact pad on the front surface of the substrate.

In some embodiments, the substrate is in contact with a bottom surface of the shielding layer.

Another aspect of the present disclosure provides a semiconductor structure, including a substrate having a front surface and a back surface, at least one semiconductor device, a first TSV disposed in the substrate, an insulating layer surrounding the first TSV, a shielding layer surrounding the insulating layer, and a second TSV adjacent to the first TSV. The semiconductor device is disposed in a device region of the substrate. The first TSV is exposed by the front surface and the back surface of the substrate. The insulating layer includes an electrically insulating material. The shielding layer includes an electrically conductive material coupled to ground through a second contact pad under the back surface of the substrate. The second TSV is exposed by the front surface and the back surface of the substrate.

In some embodiments, the first TSV and the second TSV are a substantially cylindrical shape, and the shielding layer is disposed circumferentially about the first TSV.

In some embodiments, a distance between the first TSV and the second TSV is between 1.5 to 2 times a radius of the first TSV.

In some embodiments, a distance between the first TSV and the second TSV is between 7.5 μm and 10 μm.

In some embodiments, the semiconductor structure further includes a second circuit layer disposed between the second contact pad under the back surface of the substrate and the shielding layer, and the second circuit layer is electrically connected to the second contact pad under the back surface of the substrate.

In some embodiments, the substrate is in contact with a bottom surface of the shielding layer.

In the present disclosure, the shielding layer in the semiconductor structure is able to drive a radiation signal to ground by dissipating energy of the radiation signal, as well as preventing inducement of a signal within the first TSV caused by the radiation signal. Since the transmission of radiation signals into the first TSV is prevented, the shielding layer is able to reduce or eliminate radiation induced noise in the first TSV. By preventing radiation signal transmission from the first TSV, the shielding layer also reduces or eliminates radiation induced noise caused by the first TSV. Due to the noise and crosstalk minimizing properties of the shielding layer, the distance between the first TSV and the second TSV can be reduced, allowing compact integration of the elements in the semiconductor structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
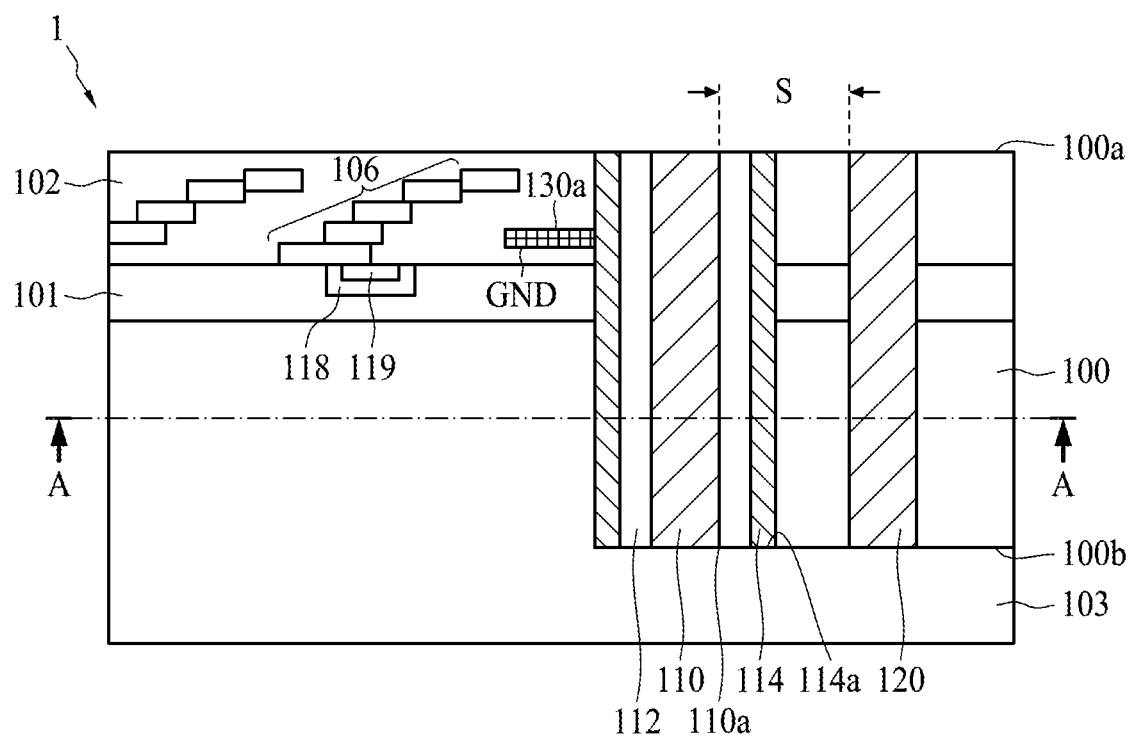
FIG. 1 is a cross-sectional view of a semiconductor structure according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor structure 1 according to some embodiments of the present disclosure. With reference to FIG. 1, in some embodiments, the semiconductor structure 1 includes a substrate 100, at least one semiconductor device 119, a first through-substrate via (TSV) 110 disposed in the substrate 100, an insulating layer 112 surrounding the first TSV 110, a shielding layer 114 surrounding the insulating layer 112, and a second TSV 120 adjacent to the first TSV 110. The semiconductor structure 1 may further includes a device region 101, a redistribution layer 102 disposed on the device region 101, and a package substrate 103. In some embodiments, the substrate 100 has a front surface 100a and a back surface 100b. The semiconductor device 119 is disposed in the device region 101 of the substrate 100. Moreover, the semiconductor device 119 may be an active device which may be included in a semiconductor die 118 electrically connected to the metal and via layers 105 of the redistribution layer 102. The semiconductor device 119 may be, for example, an electrical fuse, a diode, a variable capacitance diode, a thyristor, a field effect transistor, a bipolar transistor, or any other type of semiconductor devices known in the art that generates and/or is sensitive to receiving radiation transmissions. The metal and via layers 105 may be, for example, alternating metal layers and via layers in the redistribution layer 102. The package substrate 103 may be attached to the substrate 100 by solder balls (not shown) disposed between the substrate 100 and the package substrate 103. Moreover, the package substrate 103 may also include additional interconnect or redistribution layers (not shown).

In some embodiments, the first TSV 110 is exposed by the front surface 100a and the back surface 100b of the substrate 100. The insulating layer 112 includes an electrically insulating material, such as a polyimide material, for example. In some embodiments, the insulating layer 112 extends circumferentially about the longitudinal length of the first TSV 110, and the insulating layer 112 does not extend over the front surface 100a or the bottom surface 100b of the substrate 100. The insulating layer 112 may be an inter fan-out wafer-level layer fabricated by fan-out wafer-level packaging techniques known to those skilled in the art, for instance. In some embodiments, the first TSV 110 extends through the insulating layer 112 and may couple vias (not shown) formed at two ends of the first TSV 110 to each other. In some embodiments, the first TSV 110 and the second TSV 120 have a substantially cylindrical shape extending along a longitudinal axis. The second TSV 120 may be adjacent to the first TSV 110 according to some embodiments, and the second TSV 120 may be exposed by the front surface 100*a* and the back surface 100*b* of the substrate 100. The second TSV 120 may couple vias (not shown) formed at two ends of the second TSV 120 to each other.

In some embodiments, the shielding layer 114 includes an electrically conductive material coupled to ground GND through a ground layer 130*a*. In some embodiments, the substrate 100 is in contact with a bottom surface 114*a* of the shielding layer 114. The shielding layer 114 is electrically isolated from the first TSV 110 by the insulating layer 112. In some embodiments, the ground layer 130*a* may be connected to other elements in the redistribution layer 102 of the semiconductor structure 1. In some embodiments, the shielding layer 114 prevents radiation signal transmission to or from the first TSV 110. The shielding layer 114 may also isolate the first TSV 110 from the radiation signals generated by the semiconductor device 119. For instance, when a radiation signal is generated near the first TSV 110, the radiation signal encounters the shielding layer 114 before reaching the first TSV 110. The shielding layer 114 is able to drive the radiation signal to ground GND through the ground layer 130*a* by dissipating energy of the radiation signal, as well as preventing inducement of a signal within the first TSV 110 caused by the radiation signal. Accordingly, since the transmission of radiation signals into the first TSV 110 is prevented, the shielding layer 114 is able to reduce or eliminate radiation induced noise in the first TSV 110. By preventing radiation signal transmission from the first TSV 110, the shielding layer 114 also reduces or eliminates radiation induced noise caused by the first TSV 110. Due to the noise and crosstalk reduction properties of the shielding layer 114, a distance S between the first TSV 110 and the second TSV 120 may be reduced, leading to compact integration of the elements in the semiconductor structure 1.

In some embodiments, the shielding layer 114 fully encircles an outer surface 110*a* of the first TSV 110. In other embodiments, the shielding layer 114 may be disposed in layers above and/or below the substrate 100. As shown in FIG. 1, according to some embodiments, the shielding layer 114 extends into the redistribution layer 102, which may serve to limit radiation transmission between elements of the metal and via layers 105. It should be appreciated by those skilled in the art that the configuration of the shielding layer 114 may be modified according to an application of the semiconductor structure 1. For example, in some embodiments, the shielding layer 114 may extend into both the package substrate 103 and the redistribution layer 102. In other embodiments, the shielding layer 114 may only extend into package substrate 103. In some embodiments, according to the application of the semiconductor structure 1, the lengths of the first TSV 110 and the shielding layer 114 along the longitudinal axis may be different from each other. In other embodiments, the lengths of the first TSV 110 and the shielding layer 114 along the longitudinal axis may be the same. Moreover, the shielding layer 114 may be insulated by additional inter fan-out insulating layers (not shown) that may insulate the shielding layer 114 from surrounding package elements. In some embodiments, the bottom surface 114*a* of the shielding layer 114 may include a dielectric layer (not shown) made of silicon oxide, silicon dioxide, silicon oxynitride, or a combination thereof. In some embodiments, the first TSV 110, the shield structure 114, and the second TSV 120 may be made of a same electrically conductive material, such as copper, for example. However, embodiments of the disclosure are not limited thereto. A person having ordinary skill in the art would be capable of making proper modifications to the first TSV 110, the shield structure 114, and the second TSV 120, as well as other elements of the semiconductor structure 1 depending on the actual application.

Figure 2:
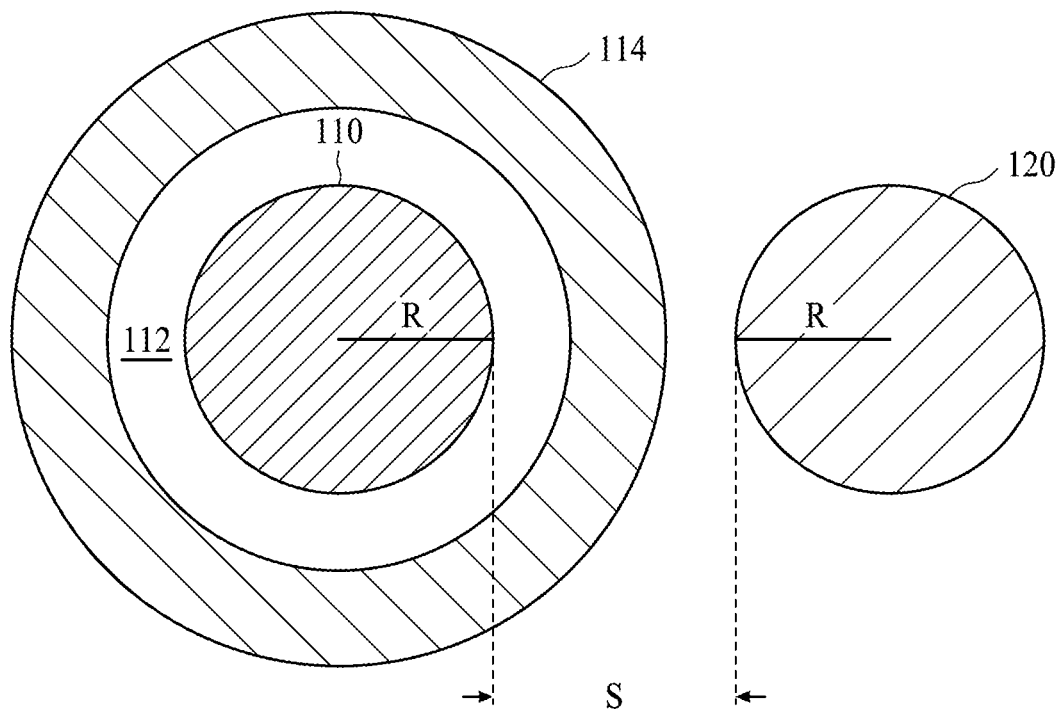
FIG. 2 is a top view of a semiconductor structure along a line A-A according to an embodiment of the present disclosure.
Figure 3:
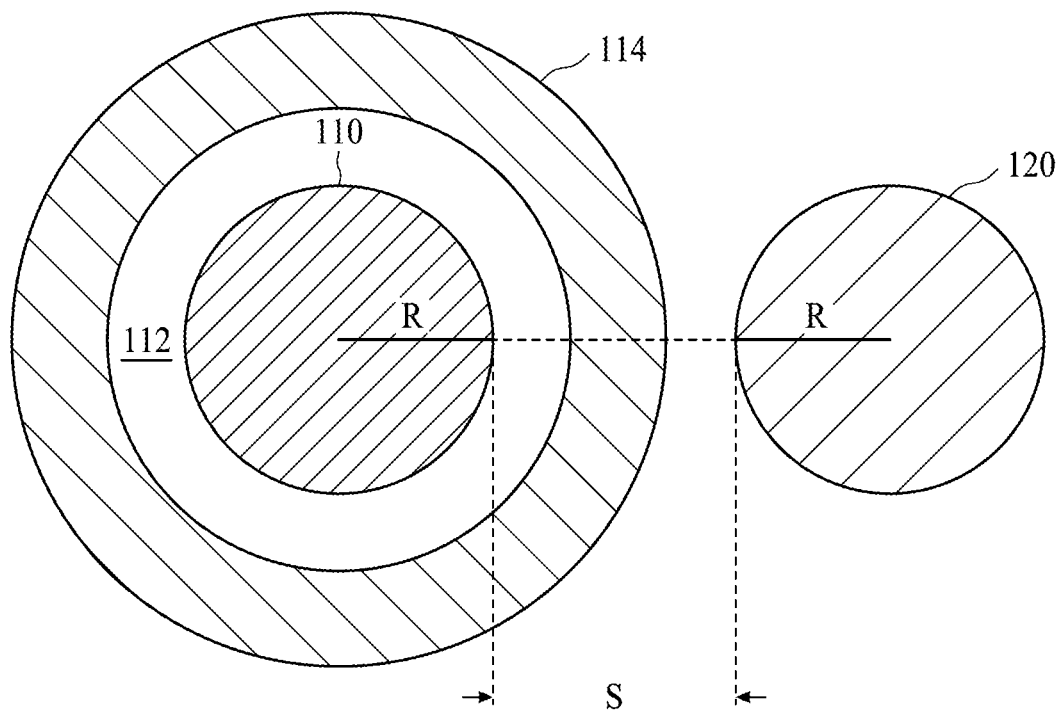
FIG. 3 is a top view of a semiconductor structure along the line A-A according to another embodiment of the present disclosure.

FIG. 2 is a top view of the semiconductor structure 1 along a line A-A in FIG. 1 according to an embodiment of the present disclosure. FIG. 3 is a top view of the semiconductor structure 1 along the line A-A in FIG. 1 according to another embodiment of the present disclosure. With reference to FIG. 2, a configuration of the first TSV 110 and the second TSV 120 is depicted. In the configuration shown in FIG. 2, the distance S between the first TSV 110 and the second TSV 120 is substantially equal to 2 times a radius R of the first TSV 110. In some embodiments, according to the application of the semiconductor structure 1, the shielding layer 114 disposed circumferentially about the first TSV 110 may enable the distance S between the first TSV 110 and the second TSV to be reduced, as shown in FIG. 3. With reference to FIG. 3, a configuration of the first TSV 110 and the second TSV 120 with a reduced spacing between the two TSVs 110 and 120 is depicted. In the configuration shown in FIG. 3, the distance S between the first TSV 110 and the second TSV 120 is substantially equal to 1.5 times the radius R of the first TSV 110. In some embodiments, the distance S between the first TSV 110 and the second TSV 120 may be between 1.5 to 2 times the radius R of the first TSV 110. In some embodiments, the distance S between the first TSV 110 and the second TSV 120 may be between 7.5 μm and 10 μm. According to some embodiments of the disclosure, the noise and crosstalk minimizing properties of the shielding layer 114 allow the distance S between the first TSV 110 and the second TSV 120 to be reduced, resulting in compact integration of the elements in the semiconductor structure 1. When the shielding layer 114 encircling the first TSV 110 is absent, the distance S between the first TSV 110 and the second TSV 120 may need to be increased to more than twice the radius R of the first TSV 110, due to the noise and crosstalk minimizing properties of the shielding layer 114 are necessary for compact integration of the elements in the semiconductor structure 1.

It should be appreciated by those skilled in the art that, in some embodiments, although the radii of the first TSV 110 and the second TSV 120 are shown to be substantially equal in FIG. 2 and FIG. 3, the radii of the first TSV 110 and the second TSV 120 may be modified to be different from each other according to the application of the semiconductor structure 1. It should be further noted that the number of the second TSV 120 adjacent to the first TSV 110 is not limited by the configurations shown in FIG. 2 and FIG. 3.

Figure 4:
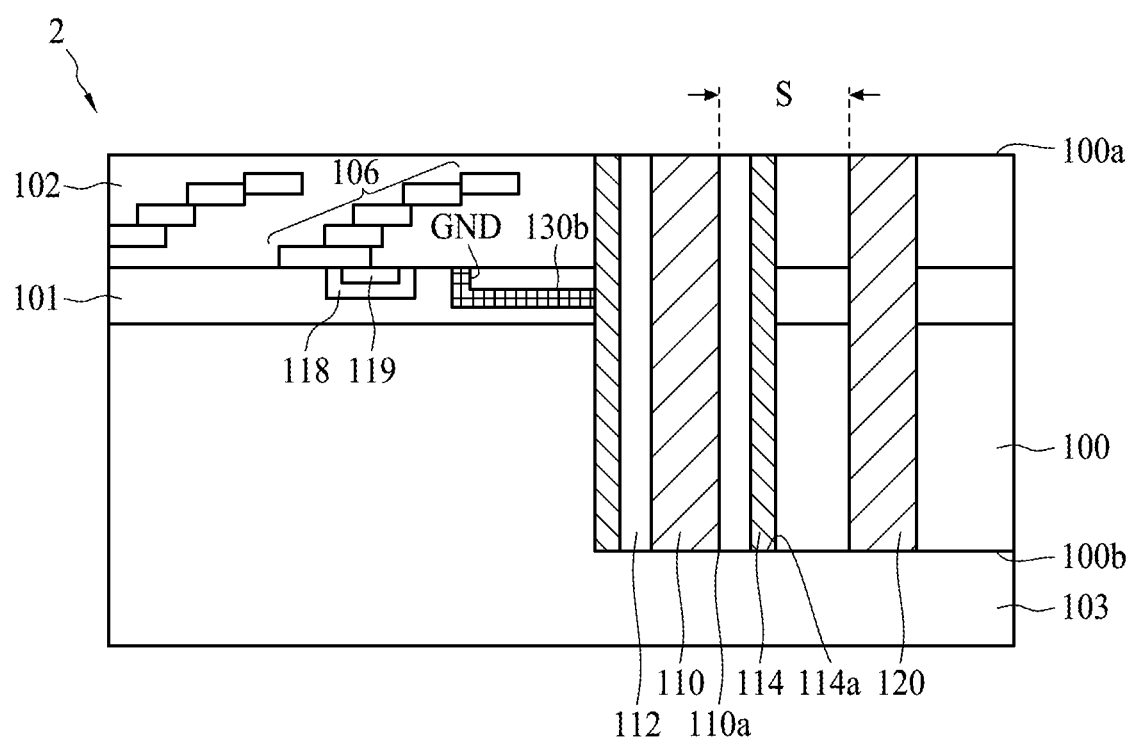
FIG. 4 is a cross-sectional view of a semiconductor structure according to some embodiments of the present disclosure.

Although the ground layer 130*a* is disposed in the redistribution layer 102 of the semiconductor structure 1 depicted in FIG. 1, in some embodiments, the ground layer 130*a* coupling the shielding layer 114 of the first TSV 110 to ground GND may be disposed in different areas of the semiconductor structure 1. FIG. 4 is a cross-sectional view of a semiconductor structure 2 according to some embodiments of the present disclosure. With reference to FIG. 4, the semiconductor structure 2 is similar to the semiconductor structure 1 of FIG. 1, except that a ground layer 130*b* is disposed in the device region 101 of the substrate 100. As shown in FIG. 4, with the ground layer 130*b* disposed in device region 101 about the semiconductor device 119, the ground layer 130*b* coupling the shielding layer 114 to ground GND is able to isolate the semiconductor device 119 from transmitting and/or receiving radiation signals. In some embodiments, when the semiconductor device 119 is a radio frequency (RF) emitting device, for example, the ground layer 130*b* coupling the shielding layer 114 to ground GND may prevent RF signal transmission from the semiconductor device 119 interfering with other elements of the semiconductor structure 2. In some embodiments, the ground layer 130*b* may be connected to other elements in the device region 101 of the semiconductor structure 2. The semiconductor device 119 may also include any suitable active semiconductor device generating and/or sensitive to receiving radiation transmissions.

Figure 5:
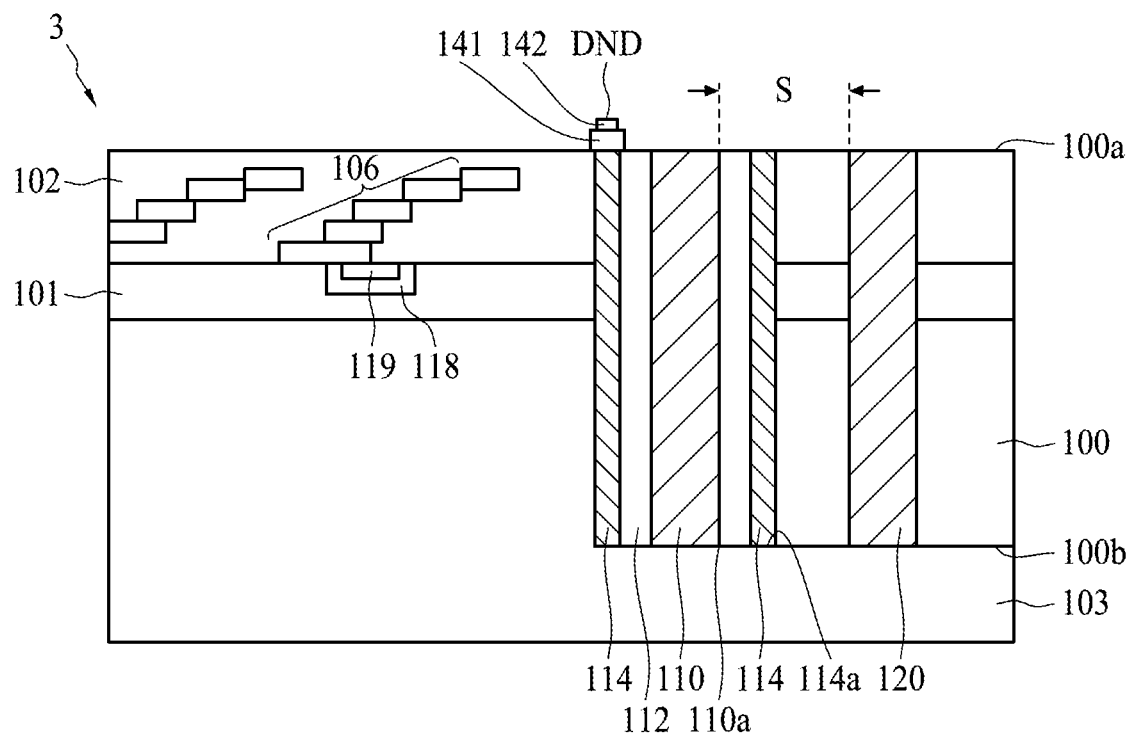
FIG. 5 is a cross-sectional view of a semiconductor structure according to some embodiments of the present disclosure.
Figure 6:
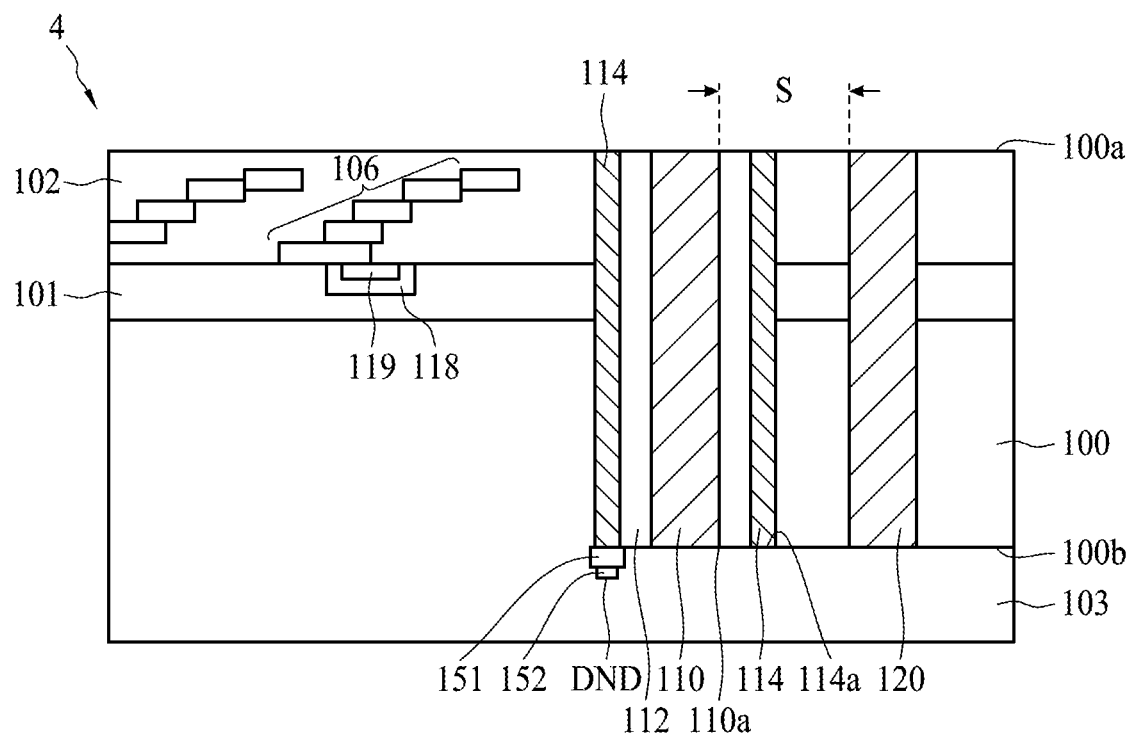
FIG. 6 is a cross-sectional view of a semiconductor structure according to some embodiments of the present disclosure.

FIG. 5 is a cross-sectional view of a semiconductor structure 3 according to some embodiments of the present disclosure. With reference to FIG. 5, the semiconductor structure 3 is similar to the semiconductor structure 1 of FIG. 1, except that the shielding layer 114 is coupled to ground GND through a first contact pad 142 on the front surface 100*a* of the substrate 100. In some embodiments, the semiconductor structure 3 further includes a first circuit layer 141 disposed between the first contact pad 142 and the shielding layer 114. In some embodiments, the first circuit layer 141 is electrically connected to the first contact pad 142 on the front surface 100*a* of the substrate 100, and the first contact pad 142 is connected to ground GND. A line pitch of the circuit layer 141 may be greater than 1 for example, although embodiments of the present disclosure are not limited thereto. FIG. 6 is a cross-sectional view of a semiconductor structure 4 according to some embodiments of the present disclosure. With reference to FIG. 6, the semiconductor structure 4 is similar to the semiconductor structure 1 of FIG. 1, except that the shielding layer 114 is coupled to ground GND through a second contact pad 152 under the back surface 100*b* of the substrate 100. In some embodiments, the semiconductor structure 4 further includes a second circuit layer 151 disposed between the second contact pad 152 and the shielding layer 114. In some embodiments, the second circuit layer 151 is electrically connected to the second contact pad 152 under the back surface 100*b* of the substrate 100, and the second contact pad 152 is connected to ground GND. A line pitch of the circuit layer 151 may also be greater than 1 μm, for example, although embodiments of the present disclosure are not limited thereto. The semiconductor structures 3 and 4 depicted in FIG. 5 and FIG. 6 may be modified by those skilled in the art according to the actual application.

The semiconductor structures of the present disclosure may be fabricated by any suitable techniques known to those skilled in the art. For example, the first TSV 110, the shielding layer 114, and the second TSV 120 may be fabricated by forming trenches in the substrate 100 using reactive ion etching and/or conventional etching processes, as well as conventional plating processes. The semiconductor device 119, the device region 101, the redistribution layer 102, the circuit layers 141 and 151, and the contact pads 142 and 152 may be formed using suitable etching and deposition processes. Chemical mechanical planarization (CMP) processes may be performed on the front surface 100*a* and the back surface 100*b* of the substrate 100 to remove excess materials. It should be noted that, the substrate 100 may include any suitable material including, but not limited to, Si, SiC, SiGe, SiGeC, GaAs, InP, InAs, and other II/VI or III/V compound semiconductors. In some embodiments, the semiconductor structures of the present disclosure may include additional interconnection structures (not shown), including alternating stacking of wiring layers and vias, and one or more interlayer dielectrics encircling the wiring layers and the vias (not shown). The substrate 100 may include a semiconductor wafer, semiconductor chip, or wafer portion, for example. It should be noted that, the substrate 100 may also be any of a variety of other structures known to those skilled in the art including, but not limited to, ceramic and organic based substrates.

Accordingly, the shielding layer 114 is able to drive a radiation signal to ground GND by dissipating energy of the radiation signal, as well as preventing inducement of a signal within the first TSV 110 caused by the radiation signal. Since the transmission of radiation signals into the first TSV 110 is prevented, the shielding layer 114 is able to reduce or eliminate radiation induced noise in the first TSV 110. By preventing radiation signal transmission from the first TSV 110, the shielding layer 114 also reduces or eliminates radiation induced noise caused by the first TSV 110. Due to the noise and crosstalk minimizing properties of the shielding layer 114, the distance S between the first TSV 110 and the second TSV 120 may be reduced, allowing compact integration of the elements in the semiconductor structure.

One aspect of the present disclosure provides a semiconductor structure, including a substrate having a front surface and a back surface, at least one semiconductor device, a first TSV disposed in the substrate, an insulating layer surrounding the first TSV, a shielding layer surrounding the insulating layer, and a second TSV adjacent to the first TSV. The semiconductor device is disposed in a device region of the substrate. The first TSV is exposed by the front surface and the back surface of the substrate. The insulating layer includes an electrically insulating material. The shielding layer includes an electrically conductive material coupled to ground through a ground layer. The second TSV is exposed by the front surface and the back surface of the substrate.

Another aspect of the present disclosure provides a semiconductor structure, including a substrate having a front surface and a back surface, at least one semiconductor device, a first TSV disposed in the substrate, an insulating layer surrounding the first TSV, a shielding layer surrounding the insulating layer, and a second TSV adjacent to the first TSV. The semiconductor device is disposed in a device region of the substrate. The first TSV is exposed by the front surface and the back surface of the substrate. The insulating layer includes an electrically insulating material. The shielding layer includes an electrically conductive material coupled to ground through a first contact pad on the front surface of the substrate. The second TSV is exposed by the front surface and the back surface of the substrate.

Another aspect of the present disclosure provides a semiconductor structure, including a substrate having a front surface and a back surface, at least one semiconductor device, a first TSV disposed in the substrate, an insulating layer surrounding the first TSV, a shielding layer surrounding the insulating layer, and a second TSV adjacent to the first TSV. The semiconductor device is disposed in a device region of the substrate. The first TSV is exposed by the front surface and the back surface of the substrate. The insulating layer includes an electrically insulating material. The shielding layer includes an electrically conductive material coupled to ground through a second contact pad under the back surface of the substrate. The second TSV is exposed by the front surface and the back surface of the substrate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
   a substrate having a front surface and a back surface opposite to the front surface;
   at least one semiconductor device disposed in a device region of the substrate;
   a first through-substrate via (TSV) disposed in the substrate, wherein two ends of the first TSV are exposed on the front surface and the back surface of the substrate;
   an insulating layer surrounding the first TSV, wherein the insulating layer comprises an electrically insulating material;
   a shielding layer surrounding the insulating layer, wherein the shielding layer comprises an electrically conductive material directly coupled to a ground layer in the substrate to be connected to ground, and the shielding layer is electrically isolated from the first TSV by the insulating layer; and
   a second TSV disposed in the substrate and in parallel to the first TSV, wherein two ends of the second TSV are exposed on the front surface and the back surface of the substrate.

2. The semiconductor structure of claim 1, wherein the first TSV and the second TSV comprise a substantially cylindrical shape, and the shielding layer is disposed circumferentially about the first TSV.

3. The semiconductor structure of claim 1, wherein a distance between the first TSV and the second TSV is between 1.5 to 2 times a radius of the first TSV.

4. The semiconductor structure of claim 1, wherein a distance between the first TSV and the second TSV is between 7.5 μm and 10 μm.

5. The semiconductor structure of claim 1, wherein the substrate is in contact with a bottom surface of the shielding layer.

6. The semiconductor structure of claim 1, wherein the ground layer is disposed in a redistribution layer of the substrate.

7. The semiconductor structure of claim 1, wherein the ground layer is disposed in the device region of the substrate.

8. A semiconductor structure, comprising:
   a substrate having a front surface and a back surface opposite to the front surface;
   at least one semiconductor device disposed in a device region of the substrate;
   a first through-substrate via (TSV) disposed in the substrate, wherein two ends of the first TSV are exposed on the front surface and the back surface of the substrate;
   an insulating layer surrounding the first TSV, wherein the insulating layer comprises an electrically insulating material;
   a shielding layer surrounding the insulating layer, wherein the shielding layer comprises an electrically conductive material directly coupled a first contact pad on the front surface of the substrate to be connected to ground, and the shielding layer is electrically isolated from the first TSV by the insulating layer; and
   a second TSV disposed in the substrate and in parallel to the first TSV, wherein two ends of the second TSV are exposed on the front surface and the back surface of the substrate.

9. The semiconductor structure of claim 8, wherein the first TSV and the second TSV comprise a substantially cylindrical shape, and the shielding layer is disposed circumferentially about the first TSV.

10. The semiconductor structure of claim 8, wherein a distance between the first TSV and the second TSV is between 1.5 to 2 times a radius of the first TSV.

11. The semiconductor structure of claim 8, wherein a distance between the first TSV and the second TSV is between 7.5 μm and 10 μm.

12. The semiconductor structure of claim 8, further comprising a first circuit layer disposed between the first contact pad on the front surface of the substrate and the shielding layer.

13. The semiconductor structure of claim 12, wherein the first circuit layer is electrically connected to the first contact pad on the front surface of the substrate.

14. The semiconductor structure of claim 8, wherein the substrate is in contact with a bottom surface of the shielding layer.

15. A semiconductor structure, comprising:
   a substrate having a front surface and a back surface opposite to the front surface;
   at least one semiconductor device disposed in a device region of the substrate;
   a first through-substrate via (TSV) disposed in the substrate, wherein two ends of the first TSV are exposed on the front surface and the back surface of the substrate;
   an insulating layer surrounding the first TSV, wherein the insulating layer comprises an electrically insulating material;
   a shielding layer disposed over the insulating layer, wherein the shielding layer comprises an electrically conductive material directly coupled to a second contact pad on the back surface of the substrate to be connected to ground, and the shielding layer is electrically isolated from the first TSV by the insulating layer; and
   a second TSV disposed in the substrate and in parallel to the first TSV, wherein two ends of the second TSV are exposed on the front surface and the back surface of the substrate.

16. The semiconductor structure of claim 15, wherein the first TSV and the second TSV comprise a substantially cylindrical shape, and the shielding layer is disposed circumferentially about the first TSV.

17. The semiconductor structure of claim 15, wherein a distance between the first TSV and the second TSV is between 1.5 to 2 times a radius of the first TSV.

18. The semiconductor structure of claim 15, wherein a distance between the first TSV and the second TSV is between 7.5 μm and 10 μm.

19. The semiconductor structure of claim 15, further comprising a second circuit layer disposed between the second contact pad under the back surface of the substrate and the shielding layer, wherein the second circuit layer is electrically connected to the second contact pad under the back surface of the substrate.

20. The semiconductor structure of claim 15, wherein the substrate is in contact with a bottom surface of the shielding layer.

* * * * *